United States Patent
Oohashi et al.

(10) Patent No.: US 12,362,718 B2
(45) Date of Patent: Jul. 15, 2025

(54) MULTILAYER BAND-PASS FILTER

(71) Applicant: TDK CORPORATION, Tokyo (JP)

(72) Inventors: Takeshi Oohashi, Tokyo (JP); Hideya Matsubara, Tokyo (JP)

(73) Assignee: TDK CORPORATION, Tokyo (JP)

( * ) Notice: Subject to any disclaimer, the term of this patent is extended or adjusted under 35 U.S.C. 154(b) by 217 days.

(21) Appl. No.: 18/071,936

(22) Filed: Nov. 30, 2022

(65) Prior Publication Data

US 2023/0231530 A1  Jul. 20, 2023

(30) Foreign Application Priority Data

Jan. 17, 2022 (JP) .................................. 2022-005217

(51) Int. Cl.
  *H03H 7/01* (2006.01)
  *H03H 9/05* (2006.01)
  *H03H 1/00* (2006.01)

(52) U.S. Cl.
  CPC ........ *H03H 7/0115* (2013.01); *H03H 7/0169* (2013.01); *H03H 9/0561* (2013.01); *H03H 2001/0085* (2013.01)

(58) Field of Classification Search
  CPC ..................... H03H 2001/0085; H03H 7/0115
  USPC .................................................. 333/175, 185
  See application file for complete search history.

(56) References Cited

U.S. PATENT DOCUMENTS

2007/0241839 A1* 10/2007 Taniguchi ............ H03H 7/1725
                                                             333/204

FOREIGN PATENT DOCUMENTS

| JP | H03-262313 A | 11/1991 |
| JP | H11-261362 A | 9/1999 |
| WO | 2019/097774 A1 | 5/2019 |

OTHER PUBLICATIONS

Translation of Jun. 3, 2025 Office Action issued in Japanese Application No. 2022-005217.

* cited by examiner

*Primary Examiner* — Rakesh B Patel
(74) *Attorney, Agent, or Firm* — Oliff PLC

(57) ABSTRACT

A band-pass filter includes a first inductor and a second inductor electromagnetically coupled to each other, a first ground terminal electrically connected to the first inductor, a second ground terminal electrically connected to the second inductor, and a stack for integrating the first inductor, the second inductor, the first ground terminal, and the second ground terminal. The first ground terminal and the second ground terminal are each connected to a ground and are not electrically connected to each other in the stack.

3 Claims, 13 Drawing Sheets

MULTILAYER BAND-PASS FILTER

BACKGROUND

1. Field of the Invention

The present disclosure relates to a multilayer band-pass filter including two inductors.

2. Description of the Related Art

Among band-pass filters used in communication apparatuses is a band-pass filter including a plurality of inductors. Each of the inductors includes a distributed constant line, for example. The distributed constant line is formed with a predetermined line length.

JP 11-261362 A describes a multilayer band-pass filter including two coils. Each of the two coils is formed of a plurality of coil electrodes formed on dielectric layers constituting a stack. The two coils are electrically connected to two respective external terminal electrodes, or specifically, two ground terminals. The two external terminal electrodes are electrically connected to each other by a ground electrode formed on a dielectric layer constituting the stack. WO 2019/097774 A describes a band-pass filter including four LC parallel resonators. Each of the four LC parallel resonators includes an inductor. The inductor is formed of line conductor patterns formed on dielectric layers constituting a stack. In any of the four LC parallel resonators, the line conductor patterns forming the inductor are electrically connected to a ground terminal formed at the bottom of the band-pass filter through other line conductor patterns, via conductor patters, and a ground conductor pattern.

The recent market demands for reductions in size and footprint of compact mobile communication apparatuses have also required miniaturization of band-pass filters for use in those communication apparatuses. In case a band-pass filter includes two inductors, the miniaturization of the band-pass filter can make electromagnetic coupling between the two inductors too strong. This can interfere with the provision of a desired characteristic.

SUMMARY

One of the objects of the present disclosure is to provide a multilayer band-pass filter that can provide a desired characteristic by reducing electromagnetic coupling between two inductors.

A multilayer band-pass filter according to the present disclosure includes a first inductor and a second inductor electromagnetically coupled to each other, a first ground terminal electrically connected to the first inductor, a second ground terminal electrically connected to the second inductor, and a stack for integrating the first inductor, the second inductor, the first ground terminal, and the second ground terminal. The first ground terminal and the second ground terminal are each connected to a ground and are not electrically connected to each other in the stack.

In the multilayer band-pass filter according to the present disclosure, the first inductor may have a first end electrically connected to the first ground terminal, and a second end opposite to the first end. The second inductor may have a third end electrically connected to the second ground terminal, and a fourth end opposite to the third end. The multilayer band-pass filter may further include a first capacitor electrically connected to the second end of the first inductor and integrated with the stack, and a second capacitor electrically connected to the fourth end of the second inductor and integrated with the stack.

In the multilayer band-pass filter according to the present disclosure, the first capacitor may be provided between the first inductor and the ground in a circuit configuration. The second capacitor may be provided between the second inductor and the ground in the circuit configuration. The first capacitor may include a first capacitor-forming conductor layer electrically connected to the ground. The second capacitor may include a second capacitor-forming conductor layer electrically connected to the ground. The first capacitor-forming conductor layer and the second capacitor-forming conductor layer may be connected to each other.

The multilayer band-pass filter according to the present disclosure may further include a first input/output terminal, a second input/output terminal, a third inductor, and a fourth inductor. The first input/output terminal, the second input/output terminal, the third inductor, and the fourth inductor may be integrated with the stack. The first inductor and the second inductor may be provided between the first input/output terminal and the second input/output terminal in the circuit configuration. The third inductor may be provided between the first inductor and the first input/output terminal in the circuit configuration. The fourth inductor may be provided between the second inductor and the second input/output terminal in the circuit configuration.

In the multilayer band-pass filter according to the present disclosure, the first ground terminal and the second ground terminal are each connected to the ground and are not electrically connected to each other in the stack. According to the present disclosure, a multilayer band-pass filter that can provide a desired characteristic by reducing electromagnetic coupling between the first and second inductors can thus be provided.

Other and further objects, features, and advantages of the present disclosure will appear more fully from the following description.

DETAILED DESCRIPTION OF THE PREFERRED EMBODIMENTS

Figure 1:
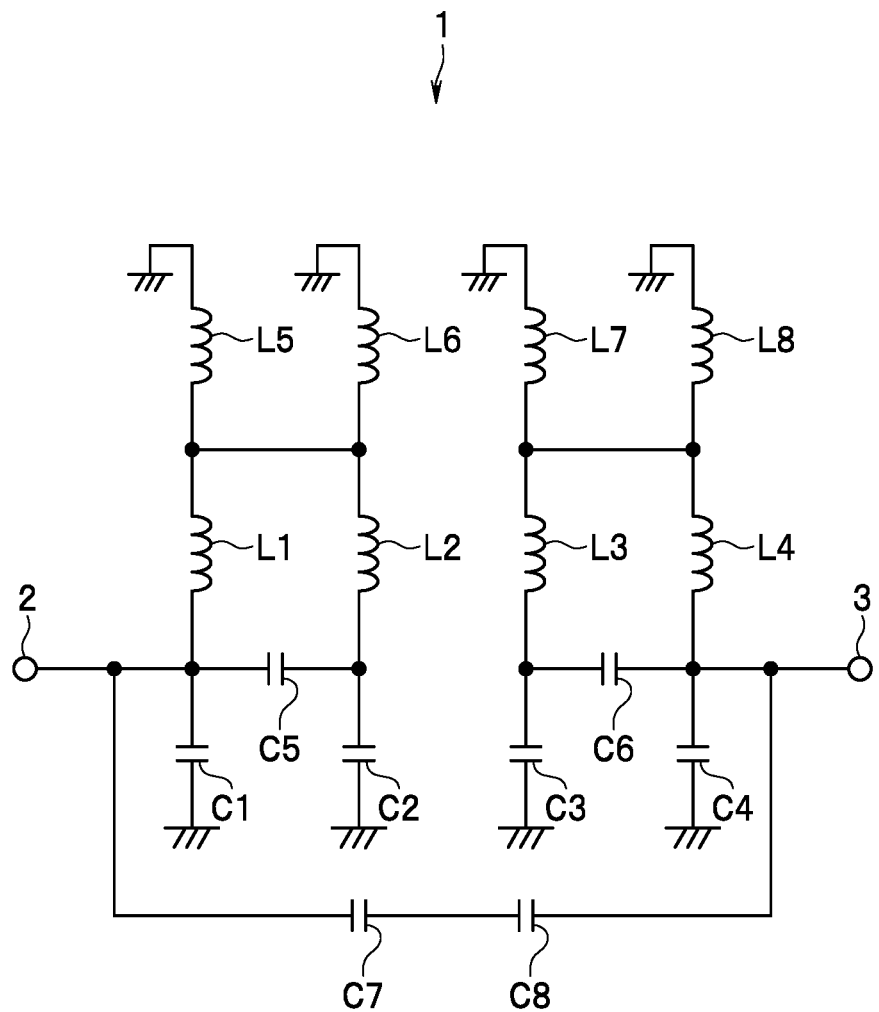
FIG. 1 is a circuit diagram showing a circuit configuration of a multilayer band-pass filter according to an embodiment of the present disclosure.

An embodiment of the present disclosure will now be described in detail with reference to the drawings. First, a configuration of a multilayer band-pass filter (hereinafter, referred to simply as a band-pass filter) 1 according to the embodiment of the present disclosure will be described. The band-pass filter 1 according to the present embodiment includes at least a first inductor and a second inductor electromagnetically coupled to each other.

An example of a circuit configuration of the band-pass filter 1 will now be described with reference to FIG. 1. The band-pass filter 1 includes a first input/output port 2, a second input/output port 3, inductors L1, L2, L3, and L4, and capacitors C1, C2, C3, C4, C5, C6, C7, and C8.

The inductors L1, L2, L3, and L4 are provided between the first and second input/output ports 2 and 3 in the circuit configuration. The inductors L1, L2, L3, and L4 are arranged in this order from the first input/output port 2 side in the circuit configuration. The inductor L1 is provided between the inductor L2 and the first input/output port 2 in the circuit configuration. The inductor L4 is provided between the inductor L3 and the second input/output port 3 in the circuit configuration. In the present application, the expression of "in the (a) circuit configuration" is used not to indicate a layout in physical configuration but to indicate a layout in the circuit diagram.

The inductor L1 corresponds to a "third inductor" in the present disclosure. The inductor L2 corresponds to a "first inductor" in the present disclosure. The inductor L3 corresponds to a "second inductor" in the present disclosure. The inductor L4 corresponds to a "fourth inductor" in the present disclosure.

The inductors L1 to L4 are configured so that the inductors L1 and L2 adjoin in the circuit configuration and are electromagnetically coupled to each other, the inductors L2 and L3 adjoin in the circuit configuration and are electromagnetically coupled to each other, and the inductors L3 and L4 adjoin in the circuit configuration and are electromagnetically coupled to each other.

The inductor L1 is connected to the first input/output port 2. The inductor L4 is connected to the second input/output port 3. The capacitor C1 is provided between the inductor L1 and a ground. The capacitor C2 is provided between the inductor L2 and the ground. The capacitor C3 is provided between the inductor L3 and the ground. The capacitor C4 is provided between the inductor L4 and the ground.

The capacitor C5 is provided between the inductor L1 and the inductor L2. The capacitor C6 is provided between the inductor L3 and the inductor L4. The capacitors C7 and C8 are provided between the first and second input/output ports 2 and 3. In the present embodiment, there is no capacitor provided between the inductor L2 and the inductor L3.

The inductor L1 and the inductor L2 are connected to each other. The inductor L3 and the inductor L4 are connected to each other. In the present embodiment, the inductor L2 and the inductor L3 are not connected to each other.

In FIG. 1, the reference symbols L5 to L8 denote inductance components occurring between the inductors L1 to L4 and the ground, respectively. Specifically, the inductance components L5 to L8 may be inductance components occurring on conductors that connect the inductors L1 to L4 to a ground electrode of a substrate on which the band-pass filter 1 is mounted. The inductance component L5 occurs between the other end of the inductor L1 and the ground. The inductance component L6 occurs between the other end of the inductor L2 and the ground. The inductance component L7 occurs between the other end of the inductor L3 and the ground. The inductance component L8 occurs between the other end of the inductor L4 and the ground. In particular, in the present embodiment, the inductance components L6 and L7 are separate inductance components.

Figure 2:
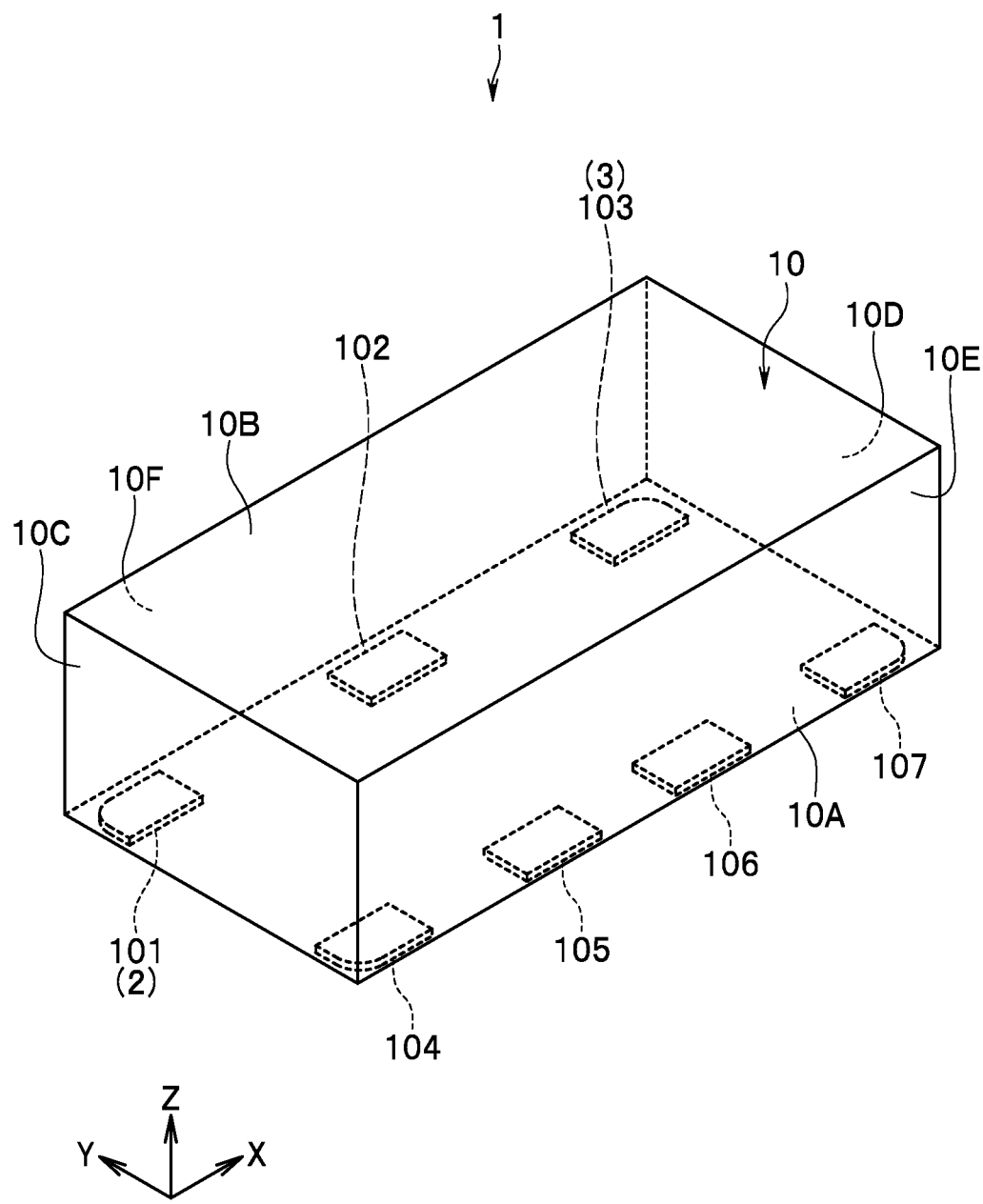
FIG. 2 is a perspective view showing an appearance of the multilayer band-pass filter according to the embodiment of the present disclosure.

Next, other configurations of the band-pass filter 1 will be described with reference to FIG. 2. FIG. 2 is a perspective view showing an appearance of the band-pass filter 1.

The band-pass filter 1 further includes a stack 10 including a plurality of dielectric layers and a plurality of conductors stacked together. The stack 10 integrates the first input/output portion 2, the second input/output port 3, the inductors L1 to L4, and the capacitors C1 to C8.

The stack 10 has a bottom surface 10A and a top surface 10B that are located at both ends in a stacking direction of the plurality of dielectric layers, and four side surfaces 10C to 10F connecting the bottom surface 10A and the top surface 10B. The side surfaces 10C and 10D are opposite to each other. The side surfaces 10E and 10F are opposite to each other. The side surfaces 10C to 10F are perpendicular to the top surface 10B and the bottom surface 10A.

Here, X, Y, and Z directions are defined as shown in FIG. 2. The X, Y, and Z directions are orthogonal to one another. In the present embodiment, a direction parallel to the stacking direction will be referred to as the Z direction. The opposite directions to the X, Y, and Z directions are defined as −X, −Y, and −Z directions, respectively.

As shown in FIG. 2, the bottom surface 10A is located at the end of the stack 10 in the −Z direction. The top surface 10B is located at the end of the stack 10 in the Z direction. The side surface 10C is located at the end of the stack 10 in the −X direction. The side surface 10D is located at the end of the stack 10 in the X direction. The side surface 10E is located at the end of the stack 10 in the −Y direction. The side surface 10F is located at the end of the stack 10 in the Y direction.

The band-pass filter 1 further includes terminals 101, 102, 103, 104, 105, 106, and 107 that are integrated with the stack 10. In particular, in the present embodiment, the terminals 101 to 107 are located at the bottom surface 10A of the stack 10. The terminals 101, 102, and 103 are arranged in this order in the X direction at positions closer to the side surface 10F than to the side surface 10E. The terminals 104, 105, 106, and 107 are arranged in this order in the X direction at positions closer to the side surface 10E than to the side surface 10F.

The first terminal 101 corresponds to the first input/output port 2. The terminal 103 corresponds to the second input/output port 3. The terminal 101 corresponds to a "first input/output terminal" in the present disclosure. The terminal 103 corresponds to a "second input/output terminal" in the present disclosure.

The terminals 102, 104, 105, 106, and 107 are each connected to the ground. The terminal 105 corresponds to a "first ground terminal" in the present disclosure. The terminal 106 corresponds to a "second ground terminal" in the present disclosure.

Next, an example of the plurality of dielectric layers and the plurality of conductors constituting the stack 10 will be described with reference to FIGS. 3 to 7. In this example, the plurality of dielectric layers include a first dielectric layer 11, a second dielectric layer 12, a third dielectric layer 13, a fourth dielectric layer 14, and one or more not-shown dielectric layers.

Figure 3:
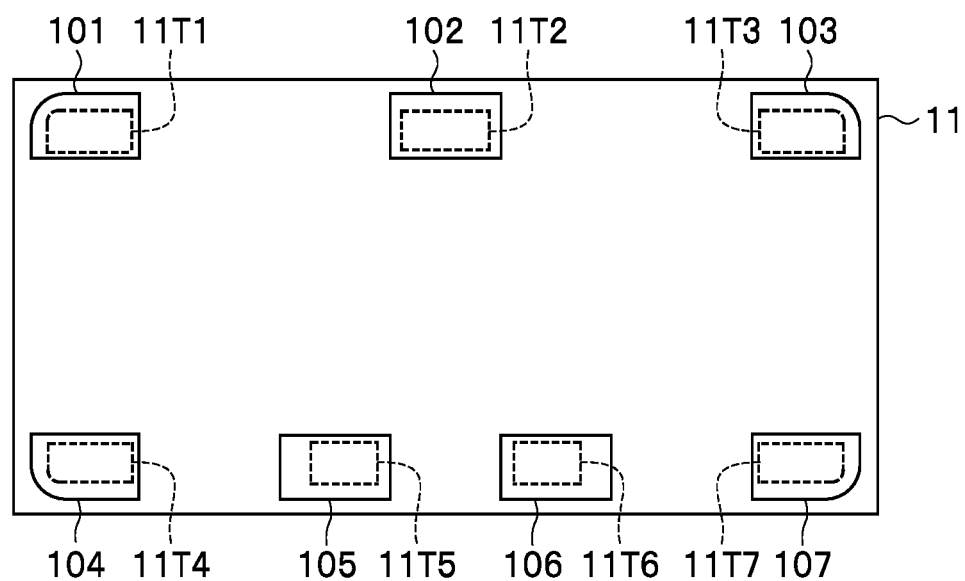
FIG. 3 is an explanatory diagram showing a terminal formation surface of a first dielectric layer in a stack of the multilayer band-pass filter according to the embodiment of the present disclosure.
Figure 4:
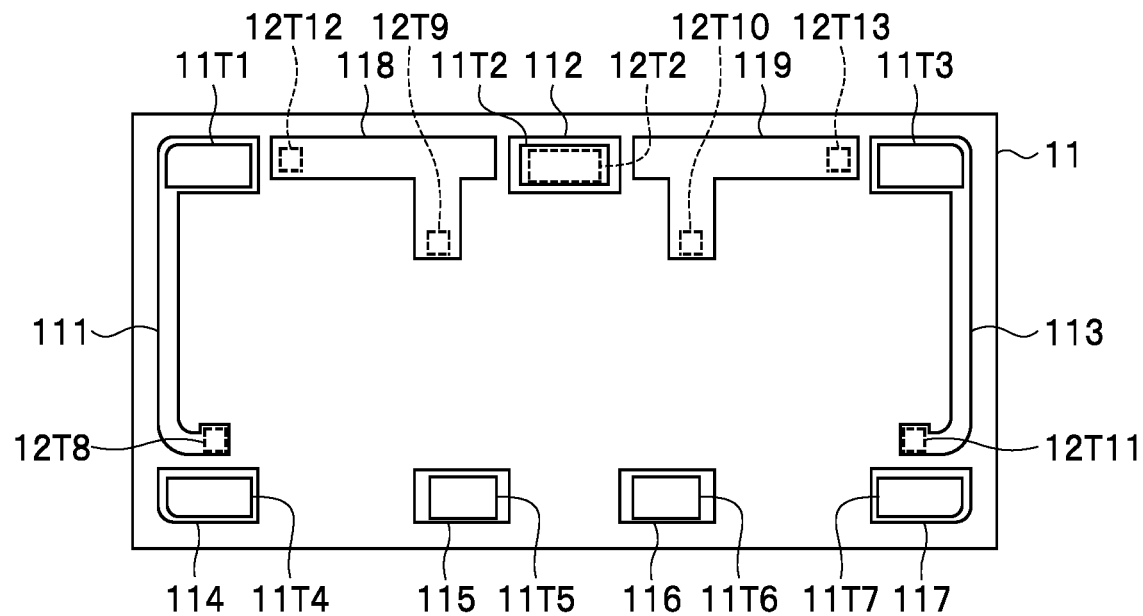
FIG. 4 is an explanatory diagram showing a patterned surface of the first dielectric layer in the stack of the multilayer band-pass filter according to the embodiment of the present disclosure.
Figure 5:
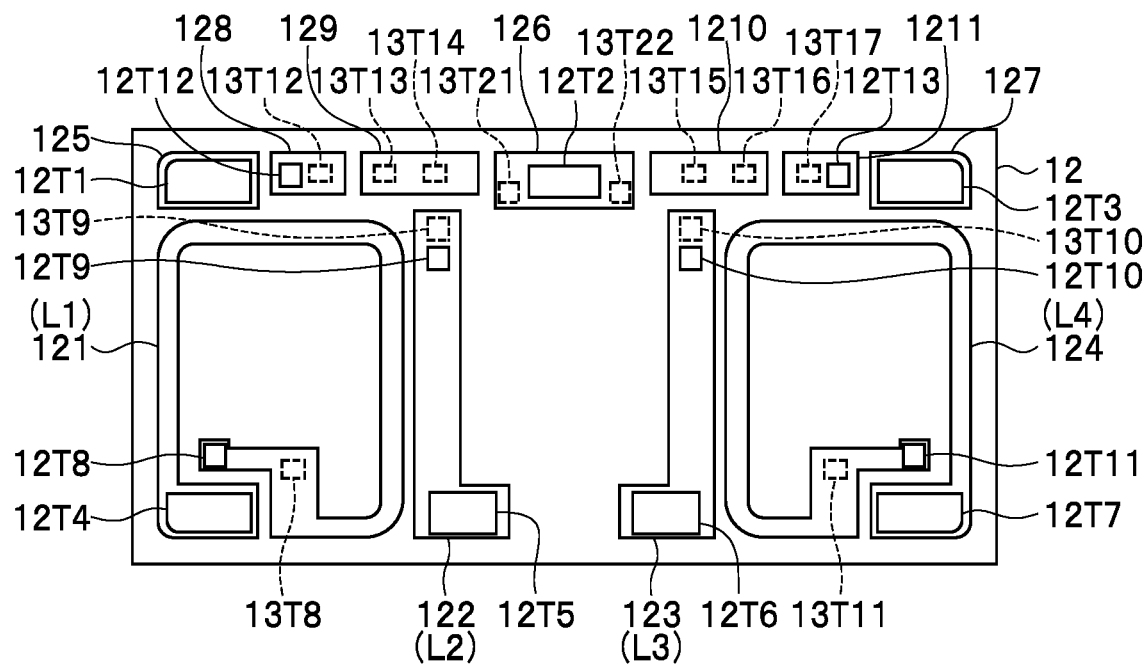
FIG. 5 is an explanatory diagram showing a patterned surface of a second dielectric layer in the stack of the multilayer band-pass filter according to the embodiment of the present disclosure.
Figure 6:
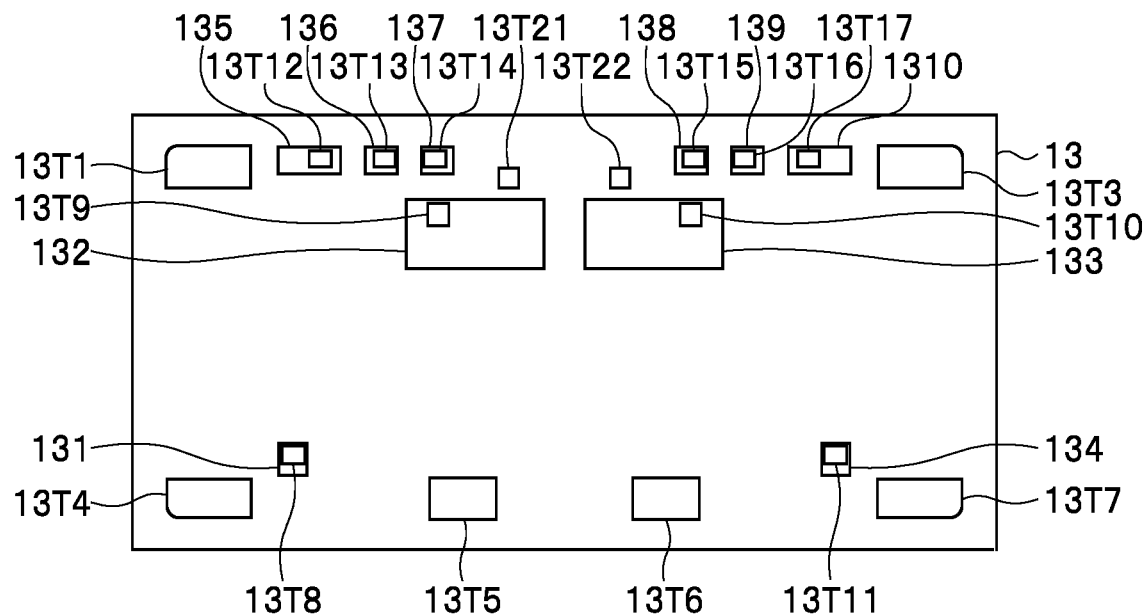
FIG. 6 is an explanatory diagram showing a patterned surface of a third dielectric layer in the stack of the multilayer band-pass filter according to the embodiment of the present disclosure.
Figure 7:
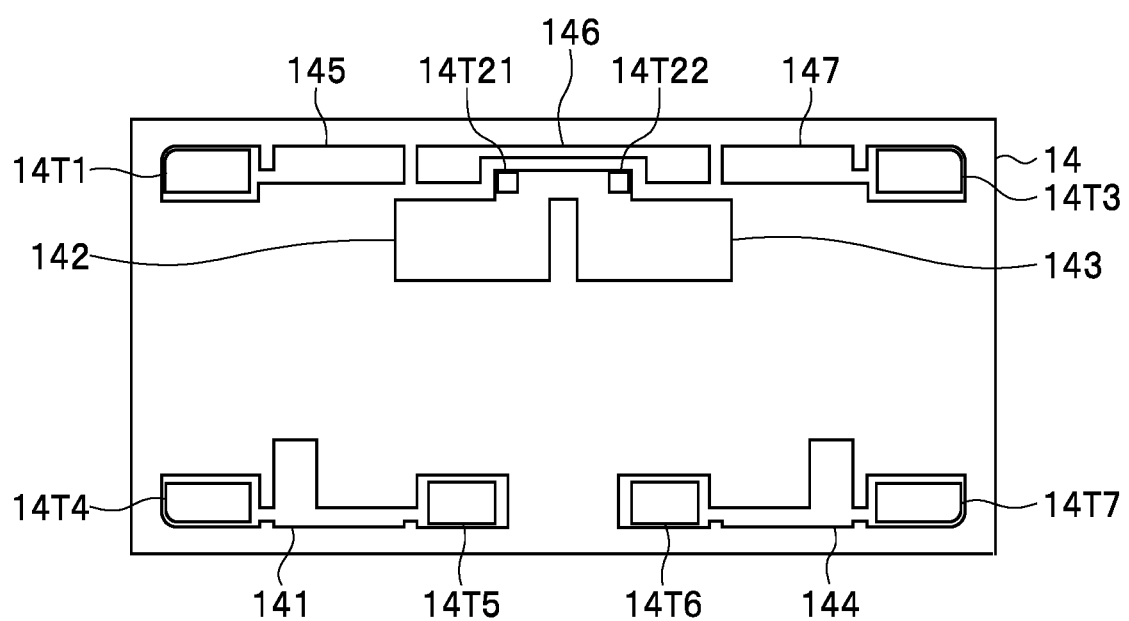
FIG. 7 is an explanatory diagram showing a patterned surface of a fourth dielectric layer in the stack of the multilayer band-pass filter according to the embodiment of the present disclosure.

FIG. 3 shows a terminal formation surface of the dielectric layer 11. FIG. 4 shows a patterned surface of the dielectric layer 11. The terminal formation surface of the dielectric layer 11 and the patterned surface of the dielectric layer 11 face opposite to each other. FIG. 5 shows a patterned surface of the dielectric layer 12. FIG. 6 shows a patterned surface of the dielectric layer 13. FIG. 7 shows a patterned surface of the dielectric layer 14. The patterned surfaces of the respective dielectric layers 12 to 14 face in the same direction as the patterned surface of the dielectric layer 11.

As shown in FIG. 3, the terminals 101 to 107 are formed on the terminal formation surface of the first dielectric layer 11. Note that FIG. 3 shows the terminals 101 to 107 as seen from the patterned surface side of the dielectric layer 11. As shown in FIG. 4, conductor layers 111, 112, 113, 114, 115, 116, 117, 118, and 119 are formed on the patterned surface of the first dielectric layer 11.

Through holes 11T1, 11T2, 11T3, 11T4, 11T5, 11T6, and 11T7 are formed in the dielectric layer 11. The through hole 11T1 connects the terminal 101 and the conductor layer 111. The through hole 11T2 connects the terminal 102 and the conductor layer 112. The through hole 11T3 connects the terminal 103 and the conductor layer 113. The through hole 11T4 connects the terminal 104 and the conductor layer 114. The through hole 11T5 connects the terminal 105 and the conductor layer 115. The through hole 11T6 connects the terminal 106 and the conductor layer 116. The through hole 11T7 connects the terminal 107 and the conductor layer 117.

For the sake of convenience, FIG. 4 shows a plurality of through holes formed in the dielectric layer 12 by dashed lines.

As shown in FIG. 5, inductor-forming conductor layers 121, 122, 123, and 124, and conductor layers 125, 126, 127, 128, 129, 1210, and 1211 are formed on the patterned surface of the second dielectric layer 12. The inductor-forming conductor layers 121, 122, 123, and 124 each have a first end and a second end that are located on opposite sides. The inductor-forming conductor layers 121 and 124 each include a plurality of portions extending in respective different directions. The inductor-forming conductor layers 122 and 123 each include a portion extending in one direction.

Through holes 12T1, 12T2, 12T3, 12T4, 12T5, 12T6, 12T7, 12T8, 12T9, 12T10, 12T11, 12T12, and 12T13 are formed in the dielectric layer 12. The through hole 12T1 connects the conductor layer 111 formed on the dielectric layer 11 and the conductor layer 125. The through hole 12T2 connects the conductor layer 112 formed on the dielectric layer 11 and the conductor layer 126. The through hole 12T3 connects the conductor layer 113 formed on the dielectric layer 11 and the conductor layer 127.

The through hole 12T4 connects the conductor layer 114 formed on the dielectric layer 11 and a portion of the conductor layer 121 near the first end thereof. The through hole 12T5 connects the conductor layer 115 formed on the dielectric layer 11 and a portion of the conductor layer 122 near the first end thereof. The through hole 12T6 connects the conductor layer 116 formed on the dielectric layer 11 and a portion of the conductor layer 123 near the first end thereof. The through hole 12T7 connects the conductor layer 117 formed on the dielectric layer 11 and a portion of the conductor layer 124 near the first end thereof.

The through hole 12T8 connects the conductor layer 111 formed on the dielectric layer 11 and a portion of the conductor layer 121 near the second end thereof. The through hole 12T9 connects the conductor layer 118 formed on the dielectric layer 11 and a portion of the conductor layer 122 near the second end thereof. The through hole 12T10 connects the conductor layer 119 formed on the dielectric layer 11 and a portion of the conductor layer 123 near the second end thereof. The through hole 12T11 connects the conductor layer 113 formed on the dielectric layer 11 and a portion of the conductor layer 124 near the second end thereof.

The through hole 12T12 connects the conductor layer 118 formed on the dielectric layer 11 and the conductor layer 128. The through hole 12T13 connects the conductor layer 119 formed on the dielectric layer 11 and the conductor layer 1211.

For the sake of convenience, FIG. 5 shows a plurality of through holes formed in the dielectric layers 13 by dashed lines.

As shown in FIG. 6, capacitor-forming conductor layers 131, 132, 133, 134, 135, 136, 137, 138, 139, and 1310 are formed on the patterned surface of the third dielectric layer 13. Through holes 13T1, 13T3, 13T4, 13T5, 13T6, 13T7, 13T8, 13T9, 13T10, 13T11, 13T12, 13T13, 13T14, 13T15, 13T16, 13T17, 13T21, and 13T22 are formed in the dielectric layer 13.

The through hole 13T8 connects the portion near the second end of the conductor layer 121 formed on the dielectric layer 12 and the conductor layer 131. The through hole 13T9 connects the portion near the second end of the conductor layer 122 formed on the dielectric layer 12 and the conductor layer 132. The through hole 13T10 connects the portion near the second end of the conductor layer 123 formed on the dielectric layer 12 and the conductor layer 133. The through hole 13T11 connects the portion near the second end of the conductor layer 124 formed on the dielectric layer 12 and the conductor layer 134.

The through hole 13T12 connects the conductor layer 128 formed on the dielectric layer 12 and the conductor layer 135. The through hole 13T13 connects the conductor layer 129 formed on the dielectric layer 12 and the conductor layer 136. The through hole 13T14 connects the conductor layer 129 formed on the dielectric layer 12 and the conductor layer 137. The through hole 13T15 connects the conductor layer 1210 formed on the dielectric layer 12 and the conductor layer 138. The through hole 13T16 connects the conductor layer 1210 formed on the dielectric layer 12 and the conductor layer 139. The through hole 13T17 connects the conductor layer 1211 formed on the dielectric layer 12 and the conductor layer 1310.

As shown in FIG. 7, capacitor-forming conductor layers 141, 142, 143, 144, 145, 146, and 147 are formed on the patterned surface of the fourth dielectric layer 14. The conductor layers 142 and 143 are connected to each other. Through holes 14T1, 14T3, 14T4, 14T5, 14T6, 14T7, 14T21, and 14T22 are formed in the dielectric layer 14. The through holes 13T1, 13T3 to 13T7, 13T21, and 13T22 shown in FIG. 6 are connected to the through holes 14T1, 14T3 to 14T7, 14T21, and 14T22, respectively.

The through holes 13T1 and 14T1 connect the conductor layer 125 formed on the dielectric layer 12 and the conductor layer 145. The through holes 13T3 and 14T3 connect the conductor layer 127 formed on the dielectric layer 12 and the conductor layer 147. The through holes 13T4 and 14T4 connect the portion near the first end of the conductor layer 121 formed on the dielectric layer 12 and the conductor layer 141. The through holes 13T5 and 14T5 connect the portion near the first end of the conductor layer 122 formed on the dielectric layer 12 and the conductor layer 141. The through holes 13T6 and 14T6 connect the portion near the first end of the conductor layer 123 formed on the dielectric layer 12 and the conductor layer 144. The through holes 13T7 and 14T7 connect the portion near the first end of the conductor layer 124 formed on the dielectric layer 12 and the conductor layer 144.

The through holes 13T21 and 14T21 connect the conductor layer 126 shown in FIG. 5 and the conductor layer 142. The through holes 13T22 and 14T22 connect the conductor layer 126 shown in FIG. 5 and the conductor layer 143.

Figure 8:
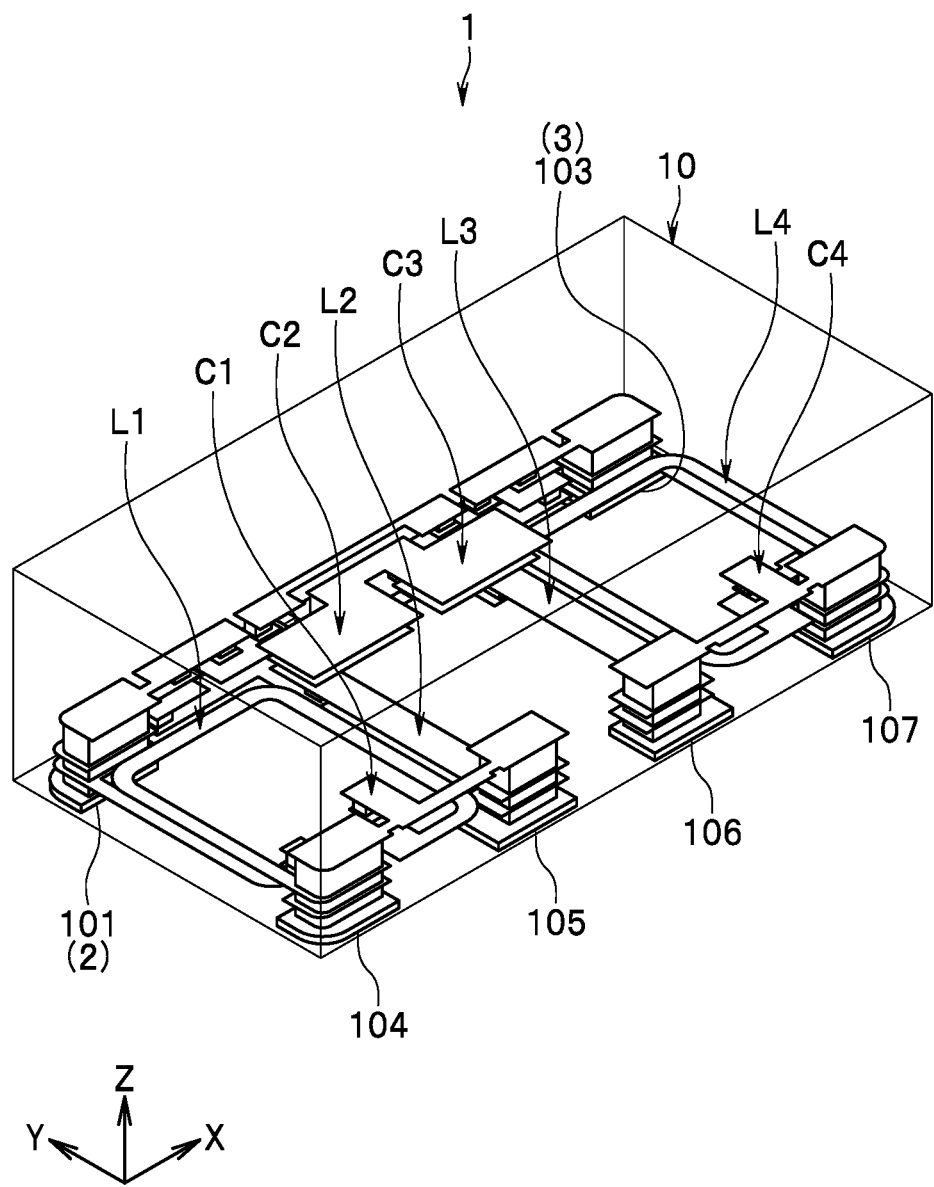
FIG. 8 is a perspective view showing an interior of the stack of the multilayer band-pass filter according to the embodiment of the present disclosure.
Figure 9:
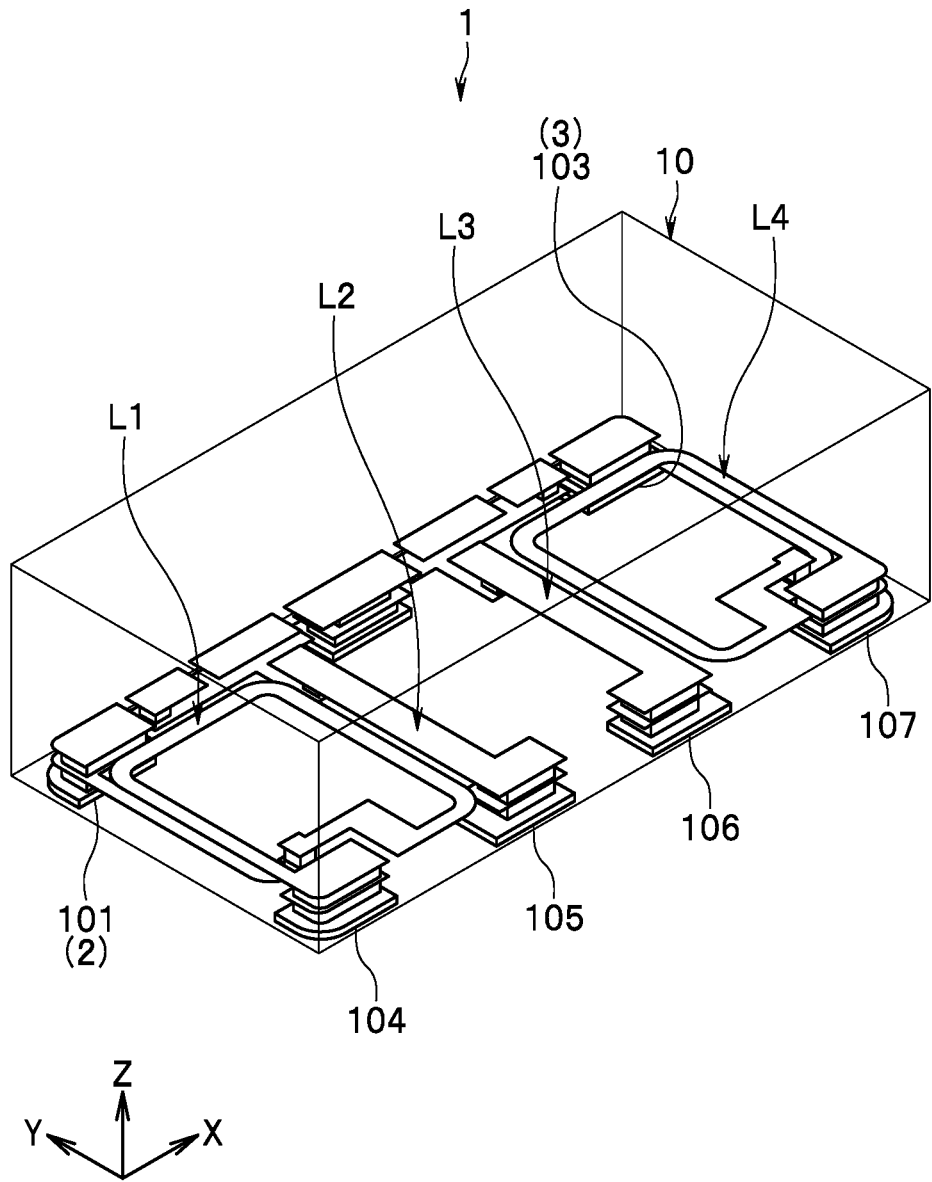
FIG. 9 is a sectional view showing a part of the interior of the stack shown in FIG. 8.

The stack 10 shown in FIG. 2 is constituted by stacking the first to fourth dielectric layers 11 to 14 and the one or more not-shown dielectric layers so that the terminal formation surface of the first dielectric layer 11 becomes the bottom surface 10A of the stack 10. FIG. 8 shows the interior of the stack 10. FIG. 9 shows a part of the interior of the stack 10. As shown in FIGS. 8 and 9, the plurality of conductor layers and the plurality of through holes (conductors) shown in FIGS. 3 to 7 are stacked inside the stack 10.

A correspondence between the circuit components of the band-pass filter 1 shown in FIG. 1 and the internal components of the stack 10 shown in FIGS. 3 to 7 will now be described. The inductor L1 is formed of the inductor-forming conductor layer 121 shown in FIG. 5. The inductor L2 is formed of the inductor-forming conductor layer 122 shown in FIG. 5. The inductor L3 is formed of the inductor-forming conductor layer 123 shown in FIG. 5. The inductor L4 is formed of the inductor-forming conductor layer 124 shown in FIG. 5.

The capacitor C1 is formed of the capacitor-forming conductor layer 131 shown in FIG. 6, the capacitor-forming conductor layer 141 shown in FIG. 7, and the dielectric layer 14 between the conductor layers. The capacitor C2 is formed of the capacitor-forming conductor layer 132 shown in FIG. 6, the capacitor-forming conductor layer 142 shown in FIG. 7, and the dielectric layer 14 between the conductor layers. The capacitor C3 is formed of the capacitor-forming conductor layer 133 shown in FIG. 6, the capacitor-forming conductor layer 143 shown in FIG. 7, and the dielectric layer 14 between the conductor layers. The capacitor C4 is formed of the capacitor-forming conductor layer 134 shown in FIG. 6, the capacitor-forming conductor layer 144 shown in FIG. 7, and the dielectric layer 14 between the conductor layers.

The capacitor C5 is formed of the capacitor-forming conductor layer 135 shown in FIG. 6, the capacitor-forming conductor layer 145 shown in FIG. 7, and the dielectric layer 14 between the conductor layers. The capacitor C6 is formed of the capacitor-forming conductor layer 1310 shown in FIG. 6, the capacitor-forming conductor layer 147 shown in FIG. 7, and the dielectric layer 14 between the conductor layers.

The capacitor C7 is formed of the capacitor-forming conductor layers 136 and 137 shown in FIG. 6, the capacitor-forming conductor layers 145 and 146 shown in FIG. 7, and the dielectric layer 14 between the conductor layers. The capacitor C8 is formed of the capacitor-forming conductor layers 138 and 139 shown in FIG. 6, the capacitor-forming conductor layers 146 and 147 shown in FIG. 7, and the dielectric layer 14 between the conductor layers.

Next, structural characteristics of the band-pass filter 1 according to the present embodiment will be described. The terminals 105 and 106 are each connected to the ground (the ground electrode of the substrate). The terminal 105 is connected to the portion near the first end of the inductor-forming conductor layer 122 constituting the inductor L2 via the through hole 11T5, the conductor layer 115, and the through hole 12T5. The terminal 106 is connected to the portion near the first end of the inductor-forming conductor layer 123 constituting the inductor L3 via the through hole 11T6, the conductor layer 116, and the through hole 12T6.

The terminals 105 and 106 are not electrically connected to each other inside the stack 10. The inductor-forming conductor layers 122 and 123 are not electrically connected to each other inside the stack 10, either. In other words, the inductor-forming conductor layers 122 and 123 are not connected to each other via one or more other conductor layers or one or more through holes.

One end of the inductor L2 corresponds to a "first end" in the present disclosure. The other end of the inductor L2 (opposite end of the inductor L2 from the one end) corresponds to a "second end" in the present disclosure. One end of the inductor L3 corresponds to a "third end" in the present disclosure. The other end of the inductor L3 (opposite end of the inductor L3 from the one end) corresponds to a "fourth end" in the present disclosure.

The one end (first end) of the inductor L2 is electrically connected to the terminal 105 that is connected to the ground. The one end (third end) of the inductor L3 is electrically connected to the terminal 106 that is connected to the ground. The terminals 105 and 106 are not electrically connected to each other inside the stack 10.

The capacitor C2 is electrically connected to the other end (second end) of the inductor L2. The capacitor C3 is electrically connected to the other end (fourth end) of the inductor L3.

The electromagnetic coupling between the inductors L2 and L3 increases with decreasing distance between the inductors L2 and L3. When the stack 10 is miniaturized, the electromagnetic coupling between the inductors L2 and L3 can thus be too strong. This may make the passband of the band-pass filter 1 wider than required characteristics in a certain specification.

In the present embodiment, the terminals 105 and 106 are not electrically connected to each other inside the stack 10. According to the present embodiment, the electromagnetic coupling between the inductor L2 electrically connected to the terminal 105 and the inductor L3 electrically connected to the terminal 106 can thus be reduced compared to the case where the inductors L2 and L3 are electrically connected to each other inside the stack 10. As a result, the present embodiment can achieve desired characteristics. Note that the case where the inductors L2 and L3 are electrically connected to each other inside the stack 10 is not limited to where the inductors L2 and L3 are connected to each other via one or more conductor layers and one or more through holes, but includes also the case where the inductors L2 and L3 are electrically connected to one terminal.

In case the stack 10 is miniaturized, the lengths of the inductors L2 and L3 decrease, and the inductance of each of the inductors L2 and L3 might be lower than a desired value. In the present embodiment, the inductance component L6 occurs between the inductor L2 and the ground, and the inductance component L7 occurs between the inductor L3 and the ground. The inductance components L6 and L7 are separate inductance components. According to the present embodiment, the inductances of the respective inductors L2 and L3 can thereby be substantially increased.

The result of a first simulation of the present embodiment will now be described. The first simulation used a model of a first practical example corresponding to the band-pass filter 1 according to the present embodiment and a model for a band-pass filter 201 of a comparative example.

Figure 10:
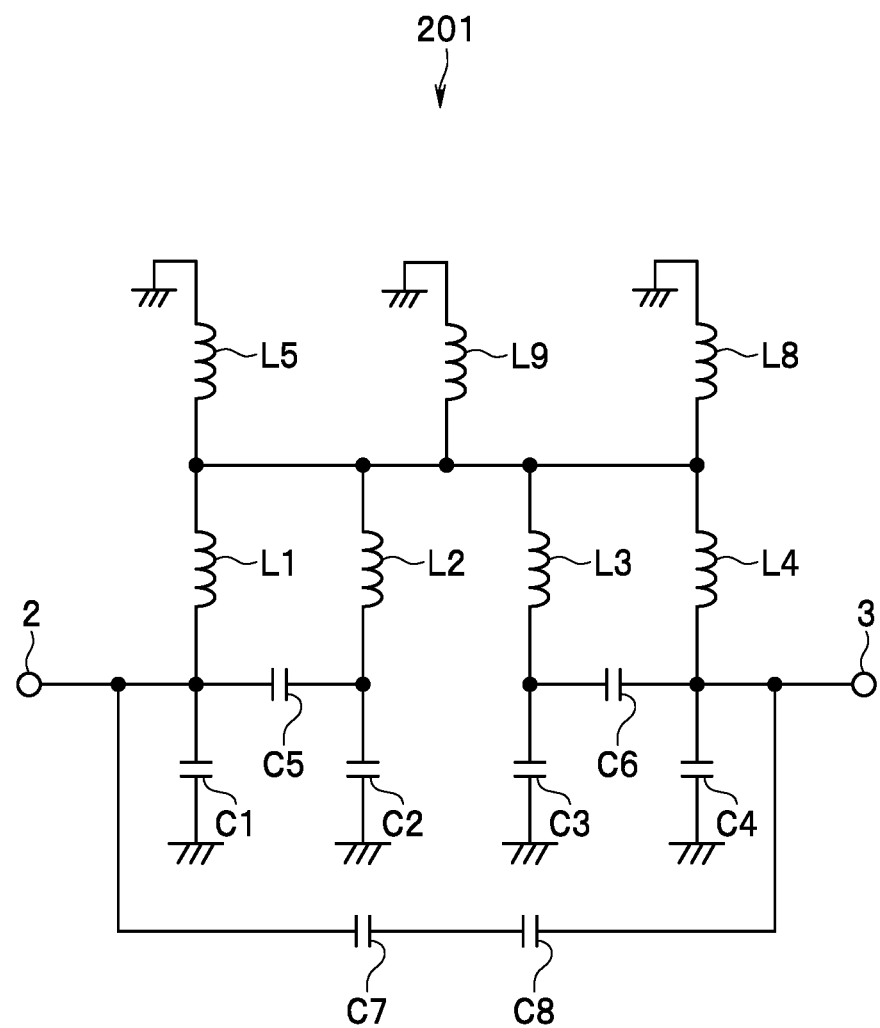
FIG. 10 is a circuit diagram showing a circuit configuration of a multilayer band-pass filter of a comparative example.

FIG. 10 is a circuit diagram showing a circuit configuration of the band-pass filter 201 of the comparative example. Similar to the band-pass filter 1 according to the present embodiment, the band-pass filter 201 of the comparative example includes inductors L1 to L4, capacitors C1 to C8, a stack 10 (see FIG. 2), and terminals 101 to 104 and 107 (see FIG. 2). The band-pass filter 201 of the comparative example also includes a terminal connected to a ground instead of the terminals 105 and 106 (see FIG. 2) in the present embodiment. The inductors L2 and L3 are electrically connected to this terminal. In the band-pass filter 201 of the comparative example, the inductors L2 and L3 are electrically connected to each other inside the stack 10. In other respects, the configuration of the band-pass filter 201 of the comparative example is the same as that of the band-pass filter 1 according to the present embodiment.

In the band-pass filter 201 of the comparative example, an inductance component L9 occurs instead of the inductance components L6 and L7 (see FIG. 1) in the present embodiment. The inductance component L9 occurs between the inductors L2 and L3 and the ground.

In the first simulation, the model of the first practical example and the model of the comparative example were each examined for the frequency characteristic of a voltage standing wave ratio at the first input/output port 2 (terminal 101), the frequency characteristic of a voltage standing wave ratio at the second input/output port 3 (terminal 103), and a pass characteristic between the first input/output port 2 (terminal 101) and the second input/output port 3 (terminal 103).

Figure 11:
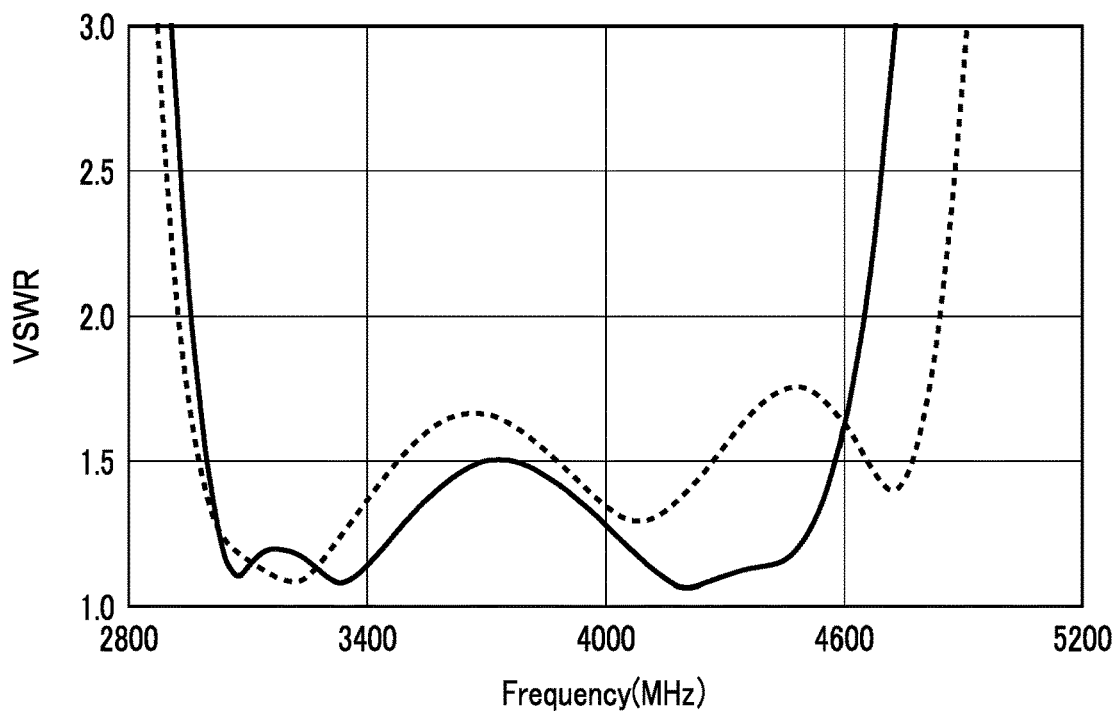
FIG. 11 is a characteristic chart showing a frequency characteristic of a voltage standing wave ratio at a first input/output port of each of models of a first practical example and the comparative example.
Figure 12:
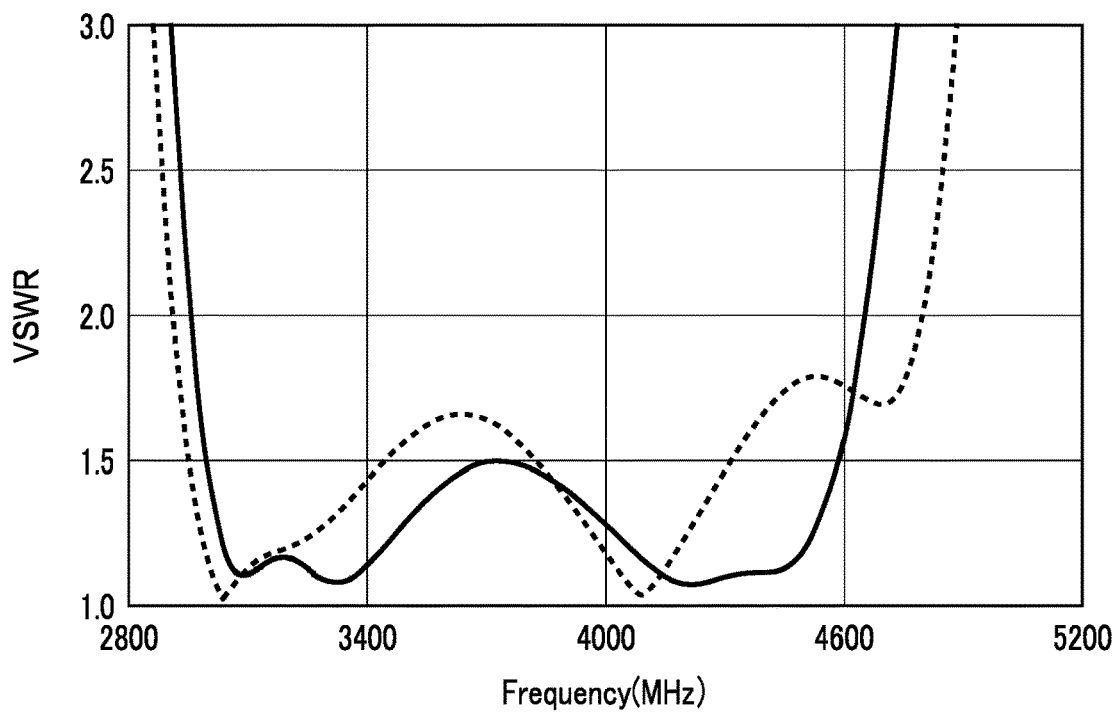
FIG. 12 is a characteristic chart showing a frequency characteristic of a voltage standing wave ratio at a second input/output port of each of the models of the first practical example and the comparative example.
Figure 13:
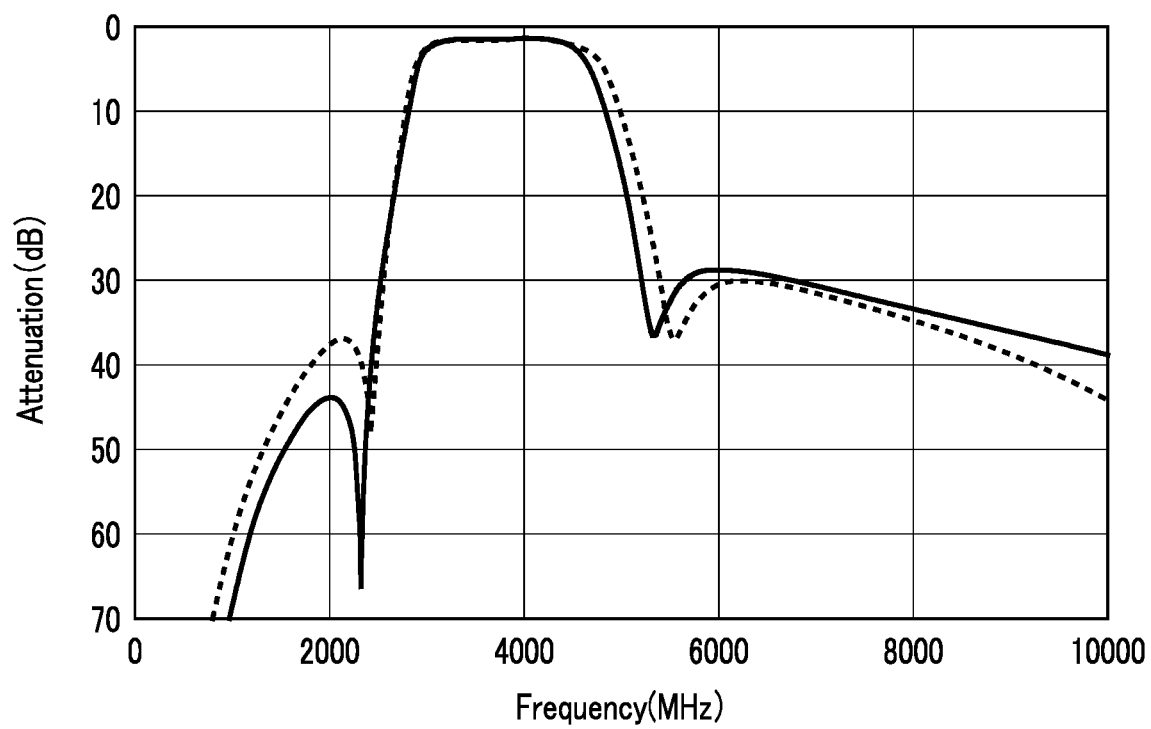
FIG. 13 is a characteristic chart showing a pass characteristic of each of the models of the first practical example and the comparative example.

FIG. 11 is a characteristic chart showing the frequency characteristic of the voltage standing wave ratio at the first input/output port 2. FIG. 12 is a characteristic chart showing the frequency characteristic of the voltage standing wave ratio at the second input/output port 3. FIG. 13 is a characteristic chart showing the pass characteristic. In FIGS. 11 to 13, the horizontal axis indicates the frequency. In FIGS. 11 and 12, the vertical axis indicates the voltage standing wave ratio (VSWR). In FIG. 13, the vertical axis indicates the attenuation. In FIGS. 11 to 13, the solid line represents the characteristic of the model of the first practical example, and the dashed line the characteristic of the model of the comparative example. Results shown in FIGS. 11 to 13 indicates that the model of the first practical example provides a narrower passband than the model of the comparative example.

As can be seen from the result of the first simulation, according to the present embodiment, the electromagnetic coupling between the inductors L2 and L3 can be reduced to satisfy the specification requirements if a relatively narrow passband is required.

MODIFICATION EXAMPLES

Figure 14:
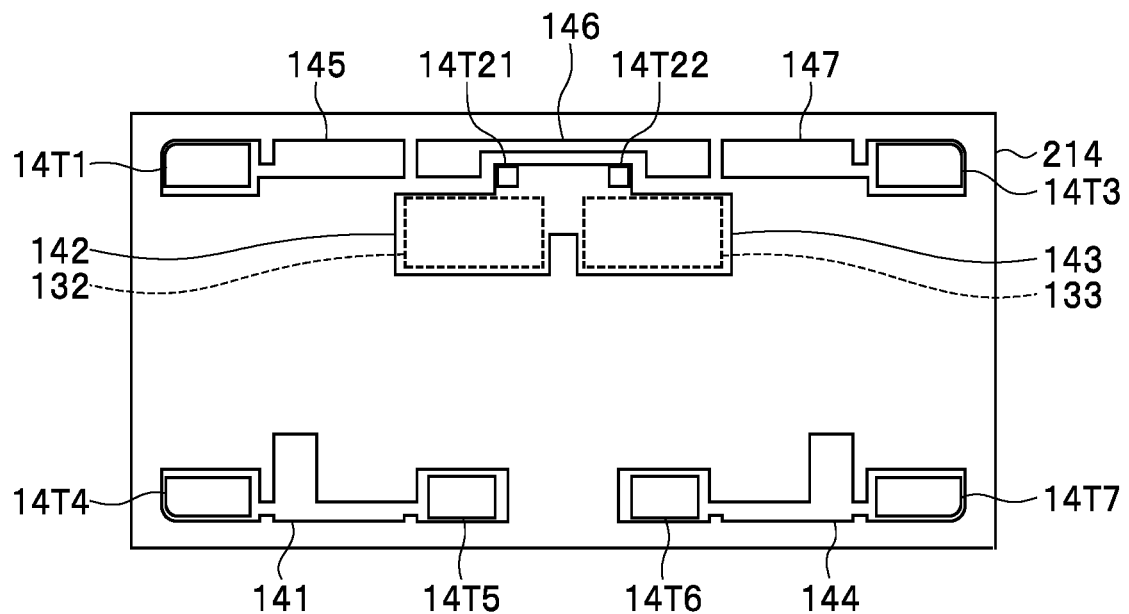
FIG. 14 is an explanatory diagram showing a patterned surface of a fourth dielectric layer in a stack of a multilayer band-pass filter of a first modification example.

Next, first and second modification examples of the band-pass filter 1 according to the present embodiment will be described. First, the first modification example will be described. In the first modification example, the stack 10 includes a dielectric layer 214 instead of the dielectric layer 14 shown in FIG. 7. FIG. 14 is an explanatory diagram showing a patterned surface of the dielectric layer 214. Like the dielectric layer 14, capacitor-forming conductor layers 141, 142, 143, 144, 145, 146, and 147 are formed on the patterned surface of the dielectric layer 214. For the sake of convenience, FIG. 14 also shows the capacitor-forming conductor layers 132 and 133 formed on the patterned surface of the dielectric layer 13 (see FIG. 6).

In the first modification example, the portion of the conductor layer 142 opposed to the conductor layer 132 and the portion of the conductor layer 143 opposed to the conductor layer 133 are located at the respective same positions as those shown in FIG. 7. However, in the first modification example, the gap between the conductor layers 142 and 143 is smaller than that between the conductor layers 142 and 143 shown in FIG. 7.

Figure 15:
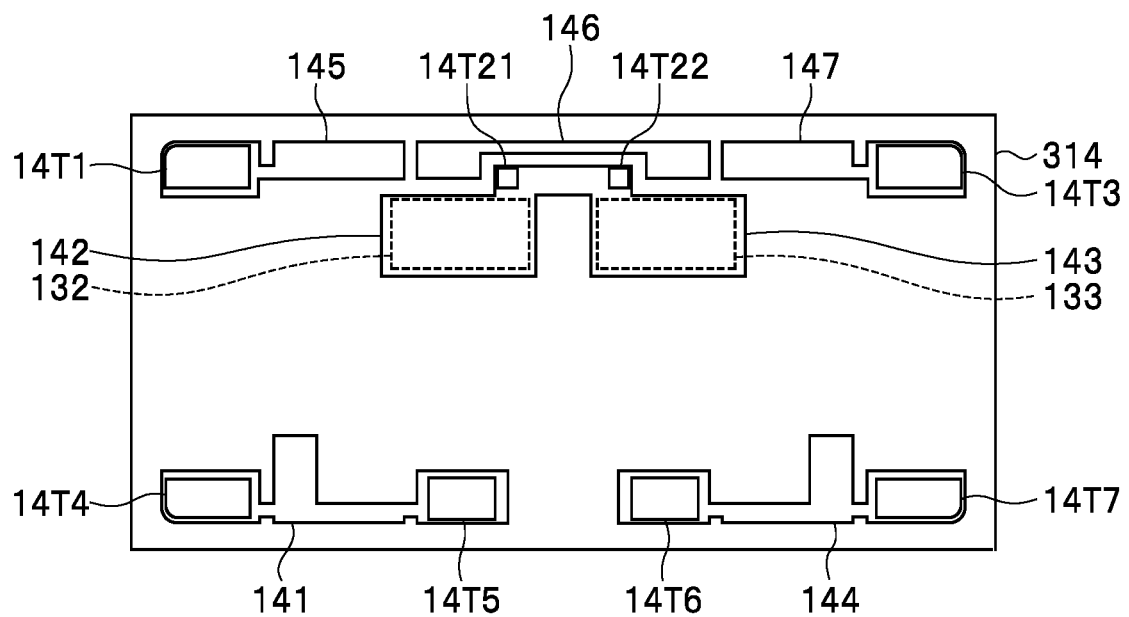
FIG. 15 is an explanatory diagram showing a patterned surface of a fourth dielectric layer in a stack of a multilayer band-pass filter of a second modification example.

Next, the second modification example will be described. In the second modification example, the stack 10 includes a dielectric layer 314 instead of the dielectric layer 14 shown in FIG. 7. FIG. 15 is an explanatory diagram showing a patterned surface of the dielectric layer 314. Like the dielectric layer 14, capacitor-forming conductor layers 141, 142, 143, 144, 145, 146, and 147 are formed on the patterned surface of the dielectric layer 314. For the sake of convenience, FIG. 15 also shows the capacitor-forming conductor layers 132 and 133 formed on the patterned surface of the dielectric layer 13 (see FIG. 6).

In the second modification example, the gap between the conductor layers 132 and 133 is greater than that between the conductor layers 132 and 133 shown in FIG. 6. In the second modification example, the gap between the portion of the conductor layer 142 opposed to the conductor layer 132 and the portion of the conductor layer 143 opposed to the conductor layer 133 is also greater than that between the two portions shown in FIG. 7.

The result of a second simulation of the first and second modification examples will be described. The second simulation used the model of the first practical example used in the first simulation, a model of a second practical example corresponding to the first modification example of the band-pass filter 1, and a model of a third practical example corresponding to the second modification example of the band-pass filter 1. In the second simulation, the models of the first to third practical examples were each examined for the frequency characteristic of a voltage standing wave ratio at the first input/output port 2 (terminal 101), the frequency characteristic of a voltage standing wave ratio at the second first/output port 3 (terminal 103), and the frequency characteristic of insertion loss of the band-pass filter 1.

Figure 16:
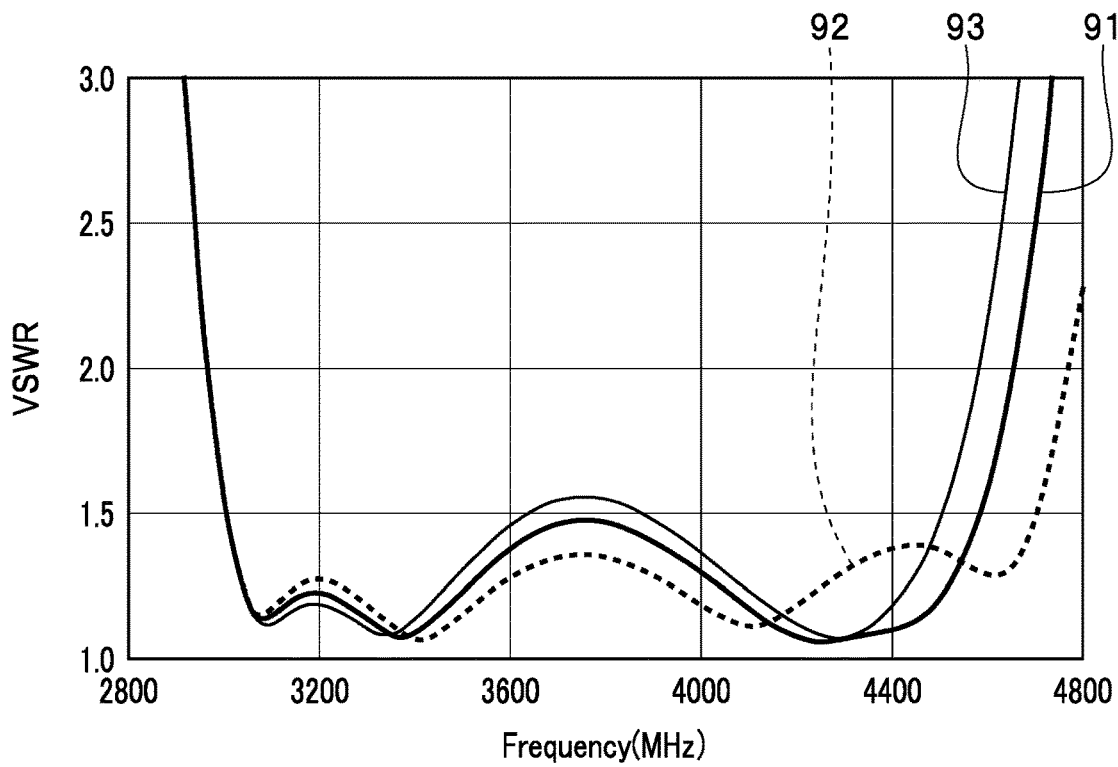
FIG. 16 is a characteristic chart showing a frequency characteristic of a voltage standing wave ratio at a first input/output port of each of the models of the first practical example to a third practical example.
Figure 17:
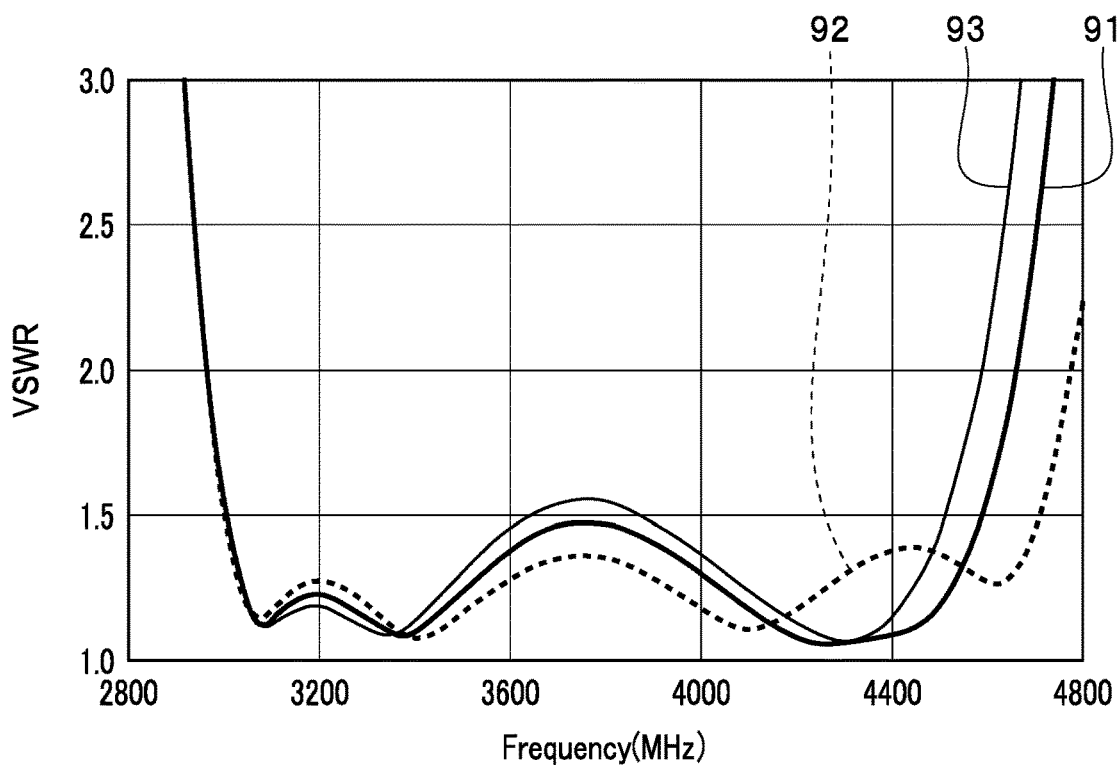
FIG. 17 is a characteristic chart showing a frequency characteristic of a voltage standing wave ratio at a second input/output port of each of the models of the first to third practical examples.
Figure 18:
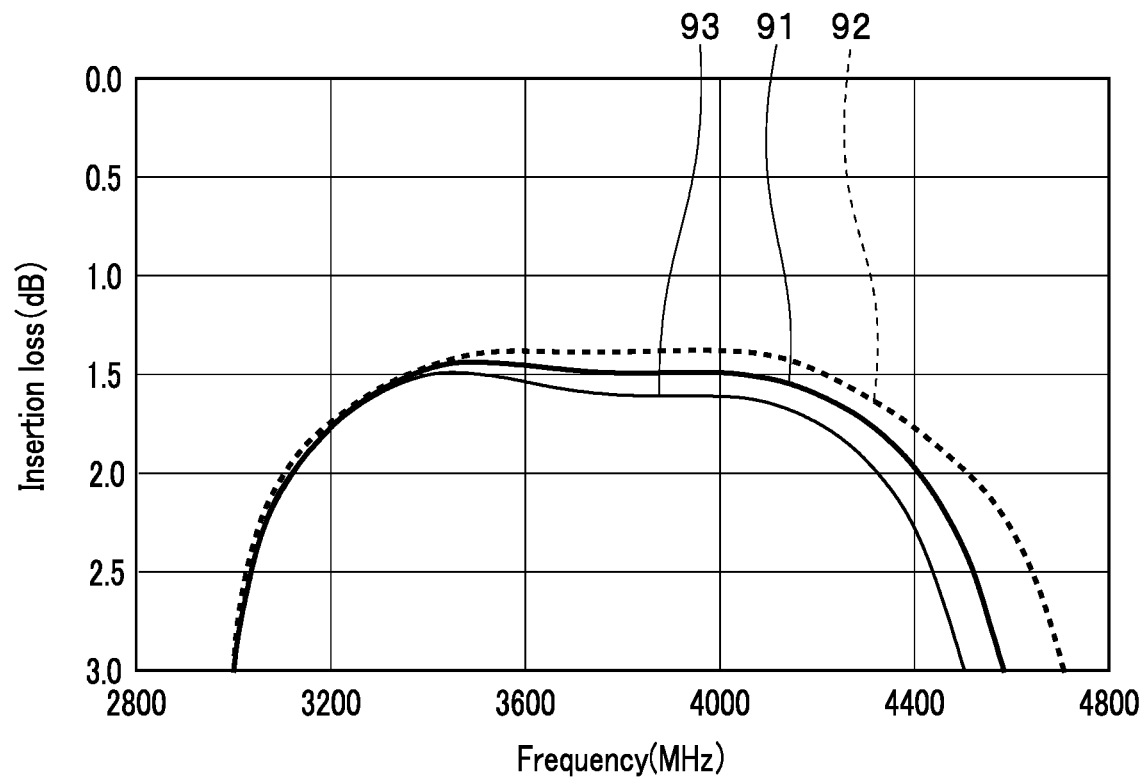
FIG. 18 is a characteristic chart showing a frequency characteristic of insertion loss of the band-pass filter in each of the models of the first to third practical examples.

FIG. 16 is a characteristic chart showing the frequency characteristic of the voltage standing wave ratio at the first input/output port 2. FIG. 17 is a characteristic chart showing the frequency characteristic of the voltage standing wave ratio at the second input/output port 3. FIG. 18 is a characteristic chart showing the frequency characteristic of the insertion loss of the band-pass filter 1. In FIGS. 16 to 18, the horizontal axis indicates the frequency. In FIGS. 16 and 17, the vertical axis indicates the voltage standing wave ratio (VSWR). In FIG. 18, the vertical axis indicates the insertion loss. In FIGS. 16 to 18, the reference numeral 91 denotes the characteristic of the model of the first practical example, the reference numeral 92 the characteristic of the model of the second practical example, and the reference numeral 93 the characteristic of the model of the third practical example. FIGS. 16 to 18 indicates that the model of the second practical example provides a passband wider than that of the model of the first practical example, and the model of the third practical example provides a passband narrower than that of the model of the first practical example. In the first modification example, the electromagnetic coupling between the inductors L2 and L3 is stronger than that of the band-pass filter 1 shown in FIGS. 1 to 9. In the second modification example, the electromagnetic coupling between the inductors L2 and L3 is weaker than that of the band-pass filter 1 shown in FIGS. 1 to 9.

As can be seen from the result of the second simulation, the characteristic (passband) of the band-pass filter 1 can be adjusted by adjusting the shapes and layout of the capacitor-forming conductor layers 132 and 133 and the capacitor-forming conductor layers 142 and 143.

The present disclosure is not limited to the foregoing embodiment, and various modifications may be made thereto. For example, the band-pass filter according to the present disclosure may include two, three, or five or more inductors instead of the inductors L1 to L4.

Obviously, many modifications and variations of the present disclosure are possible in the light of the above teachings. Thus, it is to be understood that, within the scope of the appended claims and equivalents thereof, the present disclosure may be practiced in other embodiments than the foregoing most preferable embodiment.

What is claimed is:

1. A multilayer band-pass filter comprising:
a first inductor and a second inductor electromagnetically coupled to each other;
a first ground terminal electrically connected to the first inductor;
a second ground terminal electrically connected to the second inductor; and
a stack for integrating the first inductor, the second inductor, the first ground terminal, and the second ground terminal, wherein:
the first ground terminal and the second ground terminal are not electrically connected to each other in the stack;
the first inductor has a first end electrically connected to the first ground terminal, and a second end opposite to the first end;
the second inductor has a third end electrically connected to the second ground terminal, and a fourth end opposite to the third end;
the multilayer band-pass filter further comprises,
a first capacitor directly connected to the second end of the first inductor and integrated with the stack,
a second capacitor directly connected to the fourth end of the second inductor and integrated with the stack, and
a third ground terminal that is not electrically connected to the first ground terminal and the second ground terminal in the stack;
the third ground terminal is integrated with the stack; and
the first capacitor and the second capacitor are directly connected to the third ground terminal.

2. The multilayer band-pass filter according to claim 1, wherein:
the first capacitor includes a first capacitor-forming conductor layer electrically connected to the third ground terminal;
the second capacitor includes a second capacitor-forming conductor layer electrically connected to the third ground terminal; and
the first capacitor-forming conductor layer and the second capacitor-forming conductor layer are connected to each other.

3. The multilayer band-pass filter according to claim 1, further comprising:
a first input/output terminal;
a second input/output terminal;
a third inductor; and
a fourth inductor, wherein
the first input/output terminal, the second input/output terminal, the third inductor, and the fourth inductor are integrated with the stack,
the first inductor and the second inductor are provided between the first input/output terminal and the second input/output terminal in the circuit configuration,
the third inductor is provided between the first inductor and the first input/output terminal in the circuit configuration, and
the fourth inductor is provided between the second inductor and the second input/output terminal in the circuit configuration.

* * * * *